(12) United States Patent
Barnett et al.

(10) Patent No.: US 7,917,451 B2
(45) Date of Patent: Mar. 29, 2011

(54) METHODS, APPARATUS, AND PROGRAM PRODUCTS TO OPTIMIZE SEMICONDUCTOR PRODUCT YIELD PREDICTION FOR PERFORMANCE AND LEAKAGE SCREENS

(75) Inventors: Thomas S. Barnett, Jericho, VT (US); Jeanne Paulette Spence Bickford, Essex Junction, VT (US); Nazmul Habib, South Burlington, VT (US); Susan K. Lichtensteiger, Essex Junction, VT (US); Raymond J. Rosner, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 585 days.

(21) Appl. No.: 12/046,237

(22) Filed: Mar. 11, 2008

(65) Prior Publication Data

US 2009/0234777 A1    Sep. 17, 2009

(51) Int. Cl.
*G06F 17/00* (2006.01)
(52) U.S. Cl. .................... 705/400; 716/2; 716/4
(58) Field of Classification Search .............. 705/400; 716/2, 4
See application file for complete search history.

(56) References Cited

U.S. PATENT DOCUMENTS

| | | | |
|---|---|---|---|
| 6,526,547 B2 * | 2/2003 | Breiner et al. ............. 716/56 |
| 7,139,671 B2 * | 11/2006 | Satake .................... 702/118 |
| 7,305,278 B2 | 12/2007 | Enright et al. |
| 2004/0117273 A1 | 6/2004 | Henderson et al. |
| 2004/0263365 A1 * | 12/2004 | Robinson et al. ........... 341/77 |
| 2006/0025956 A1 * | 2/2006 | Satake .................... 702/118 |
| 2008/0009959 A1 | 1/2008 | Enright et al. |
| 2009/0070716 A1 * | 3/2009 | Joshi et al. ................. 716/2 |
| 2009/0234777 A1 * | 9/2009 | Barnett et al. ............. 705/400 |

* cited by examiner

*Primary Examiner* — Shannon S Saliard
(74) *Attorney, Agent, or Firm* — Wood, Herron & Evans, LLP

(57) ABSTRACT

An apparatus, method, and program product are provided to predict yield loss associated with performance screens or leakage screens. A leakage model is correlated to an on-chip measurement. Current limited yields are determined from the leakage model. A database is formed relating performance sigma cut-points to the circuit limited yields. A product is quoted based on the circuit limited yield for one of the performance sigma cut-points taken from the database. The quote is tied to the product design and testing.

20 Claims, 4 Drawing Sheets

| RING OSCILLATOR SIGMA CUT POINT RANGE | CIRCUIT LIMITED YIELD |
|---|---|
| 3.0 FAST – 3.0 SLOW | W% |
| 2.5 FAST – 3.0 SLOW | X% |
| NOMINAL – 3.0 SLOW | Y% |
| ⋮ | ⋮ |
| 2.5 SLOW – 3.0 SLOW | Z% |

METHODS, APPARATUS, AND PROGRAM PRODUCTS TO OPTIMIZE SEMICONDUCTOR PRODUCT YIELD PREDICTION FOR PERFORMANCE AND LEAKAGE SCREENS

FIELD OF THE INVENTION

The present invention relates generally to the fabrication of integrated circuits and, more particularly, to methods, apparatus, and program products for improved product yield prediction.

BACKGROUND OF THE INVENTION

The fabrication of integrated circuits is an extremely complex process that may involve hundreds of individual operations. Essentially, the process includes the diffusion of precisely predetermined amounts of dopant material into precisely predetermined areas of a silicon wafer to produce active devices such as transistors. This is typically done by utilizing a photomask and photoresist to define a pattern of areas into which diffusion is to occur through the openings in the photoresist or through openings in a film defined by the photoresist.

After a predetermined number of such diffusion operations have been carried out to produce the desired number of transistors in the wafer, they are interconnected as required by interconnection lines. These interconnection lines, or interconnects as they are also known, are typically formed by deposition of an electrically conductive material which is defined into the desired interconnect pattern by a photomask, photoresist and etching process or is deposited into openings in an insulator film and then planarized. A typical completed integrated circuit may have millions of transistors contained within a 0.1 inch by 0.1 inch silicon chip and interconnects of submicron dimensions.

In view of the device and interconnect densities required in present day integrated circuits, it is imperative that the manufacturing processes be carried out with utmost precision and in a way that minimizes defects and maximizes parametric control. For reliable operation, the electrical characteristics of the circuits must be kept within carefully controlled limits, which implies a high degree of control over the myriad of operations and fabrication processes. For example, in the photoresist and photomask operations, the presence of contaminants such as dust, minute scratches and other imperfections in the patterns on the photomasks can produce defective patterns on the semiconductor wafers, resulting in defective integrated circuits. Further, defects can be introduced in the circuits during the diffusion operations themselves. Defective circuits may be identified both by visual inspection under high magnification and or by electrical tests. Once defective integrated circuits have been identified, it is desired to take steps to decrease the number of defective integrated circuits produced in the manufacturing process, thus increasing the yield of the integrated circuits meeting specifications.

Semiconductor technologies beyond 130 nm have high levels of leakage currents. For example, for a 130 nm technology node, leakage components of chip power may be about 10 to about 20 percent of total power. As the technologies get smaller, the observed leakage currents become higher and less predictable. At 90 nm, the leakage currents may dissipate about 25 to about 50 percent of total power and at 65 nm, the leakage currents may dissipate about 25 to about 65 percent of total power. Some semiconductor products require tighter leakage and better performance than the base technology can provide. In these cases, test screens are used to narrow the distribution around a nominal device.

A contemporary process for setting up a test screen includes proposing a screen of a statistical deviation from a nominal chip speed using, for example, IDDQ measurements for leakage current and/or a ring oscillator or scan chain measurements for performance. Peformance testing is well established and easier to implement than leakage current testing. Leakage currents are generally measured using IDDQ testing. IDDQ testing relies on measuring the supply current ($I_{dd}$) in the quiescent state when the devices are idle and not switching. Fault-free CMOS devices consume very little current while in the quiescent state with the clock stopped. In contrast, many common manufacturing faults will cause the observable leakage current of defective devices to increase by orders of magnitude, which can increase the sensitivity of IDDQ testing.

From these types of measurements and knowledge of the technology, manual estimates are performed to determine the circuit limited yield for the test screens, which is then used to determine the yield loss of the chips. The circuit limited yield and yield losses are accounted for when calculating and preparing a quote to a customer. The product is then designed and a manual evalulation is performed to determine whether the quoted criteria was met. If the screen criteria was not met, the customer is requoted and the test screen is manually implemented. Approximately two weeks are required, using this process, to produce a quote for the customer.

What is needed, therefore, is a method to automate and reduce the time for quoting product costs.

SUMMARY OF THE INVENTION

A method, apparatus and program product is provided to predict yield loss associated with performance and leakage screens. A leakage model is correlated to an on-chip measurement, such as a ring oscillator or scan chain measurement, or an IDDQ measurement. Current limited yields are determined from the leakage model and a database is formed relating performance sigma cut-points to the circuit limited yields. A product is quoted based on the circuit limited yield for one of the performance sigma cut-points taken from the database. The product may then be designed and tested using the performance cut-points to screen the product.

In some embodiments, the product is quoted to a customer at a cost, and the quoting process includes selecting a product leakage limit or a performance limit and then referencing the database to obtain the circuit limited yield corresponding to the product leakage limit or performance limit. A cost adjustment is established based upon the circuit limited yield. The cost is then modified by the adjustment to set an adjusted cost, which is then quoted to the customer. During the quoting process leakage data or performance data may be estimated. A specific performance sigma cut-point may then be identified from the performance sigma cut-points in the database that corresponds to the estimated leakage data or the estimated performance data. The circuit limited yield that corresponds to the specific performance sigma cut-point may then be obtained.

During the product design, in some embodiments, the design is verified to determine if the design matches the quote. If the design is different from the product quote, the product is requoted to the customer. A test file of performance sort criteria may be built for use in product testing.

BRIEF DESCRIPTION OF THE DRAWINGS

The accompanying drawings, which are incorporated in and constitute a part of this specification, illustrate embodi

DETAILED DESCRIPTION

Embodiments of the invention provide a method, apparatus and program product for predicting circuit limited yield for a statistical performance range for preparing quotes to customers. Performance tests screens are well established and easier to implement than screens for leakage currents. By correlating a leakage model to on-chip measurement data, known techniques for setting up screens used for performance tests can be applied to leakage currents. This whole process may then be automated to be able to produce on the fly or real time quotes to customers.

Figure 1:
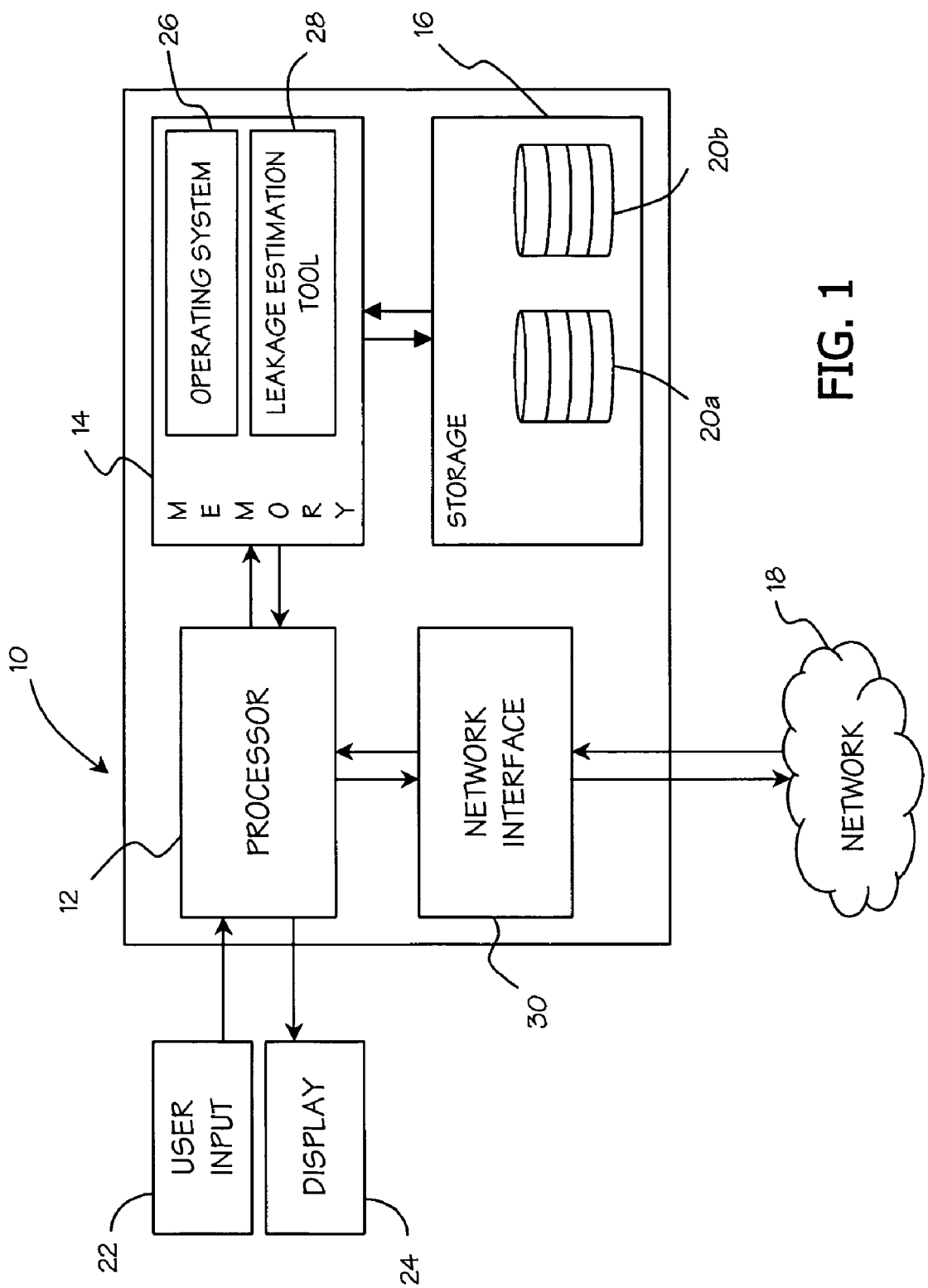
- FIG. 1 is a block diagram of an exemplary hardware and software environment for a computer suitable for implementing prediction of yield loss associated with performance and leakage screens consistent with embodiments of the invention.

Turning now to the drawings, wherein like numbers denote like parts throughout the several views, FIG. 1 illustrates an exemplary hardware and software environment for an apparatus 10 suitable for performing integrated circuit or chip yield prediction in a manner consistent with the invention. For the purposes of the invention, apparatus 10 may represent practically any computer, computer system, or programmable device, e.g., multi-user or single-user computers, desktop computers, portable computers and devices, handheld devices, network devices, mobile phones, etc. Apparatus 10 will hereinafter be referred to as a "computer" although it should be appreciated that the term "apparatus" may also include other suitable programmable electronic devices.

Computer 10 typically includes at least one processor 12 coupled to a memory 14. Processor 12 may represent one or more processors (e.g. microprocessors), and memory 14 may represent the random access memory (RAM) devices comprising the main storage of computer 10, as well as any supplemental levels of memory, e.g., cache memories, non-volatile or backup memories (e.g. programmable or flash memories), read-only memories, etc. In addition, memory 14 may be considered to include memory storage physically located elsewhere in computer 10, e.g., any cache memory in a processor 12, as well as any storage capacity used as a virtual memory, e.g., as stored on a mass storage device 16 or another computer coupled to computer 10 via a network 18. The mass storage device 16 may contain databases 20a, 20b, which may contain statistical and correlation data between circuit leakage current models and on-chip measurements, for example.

Computer 10 also typically receives a number of inputs and outputs for communicating information externally. For interface with a user or operator, computer 10 typically includes one or more user input devices 22 (e.g., a keyboard, a mouse, a trackball, a joystick, a touchpad, a keypad, a stylus, and/or a microphone, among others). Computer 10 may also include a display 24 (e.g., a CRT monitor, an LCD display panel, and/or a speaker, among others). The interface to computer 10 may also be through an external terminal connected directly or remotely to computer 10, or through another computer communicating with computer 10 via a network 18, modem, or other type of communications device.

Computer 10 operates under the control of an operating system 26, and executes or otherwise relies upon various computer software applications, components, programs, objects, modules, data structures, etc. (e.g., Leakage Estimation tool 28). The Leakage Estimation tool 28, for example, may estimate leakage currents using leakage models based on circuit speeds. These leakage values may then be used to reference the statistical data in the databases 20a, 20b to determine circuit limited yield and its associated yield loss. Computer 10 communicates on the network 18 through a network interface 30.

In general, the routines executed to implement the embodiments of the invention, whether implemented as part of an operating system or a specific application, component, program, object, module or sequence of instructions will be referred to herein as "computer program code", or simply "program code". The computer program code typically comprises one or more instructions that are resident at various times in various memory and storage devices in a computer, and that, when read and executed by one or more processors in a computer, causes that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include but are not limited to physical, recordable type media such as volatile and non-volatile memory devices, floppy and other removable disks, hard disk drives, optical disks (e.g., CD-ROM's, DVD's, etc.), among others, and transmission type media such as digital and analog communication links.

In addition, various program code described hereinafter may be identified based upon the application or software component within which it is implemented in specific embodiments of the invention. However, it should be appreciated that any particular program nomenclature that follows is merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, APIs, applications, applets, etc.), it should be appreciated that the invention is not limited to the specific organization and allocation of program functionality described herein.

Those skilled in the art will recognize that the exemplary environment illustrated in FIG. 1 is not intended to limit the present invention. Indeed, those skilled in the art will recognize that other alternative hardware and/or software environments may be used without departing from the scope of the invention.

Figure 2:
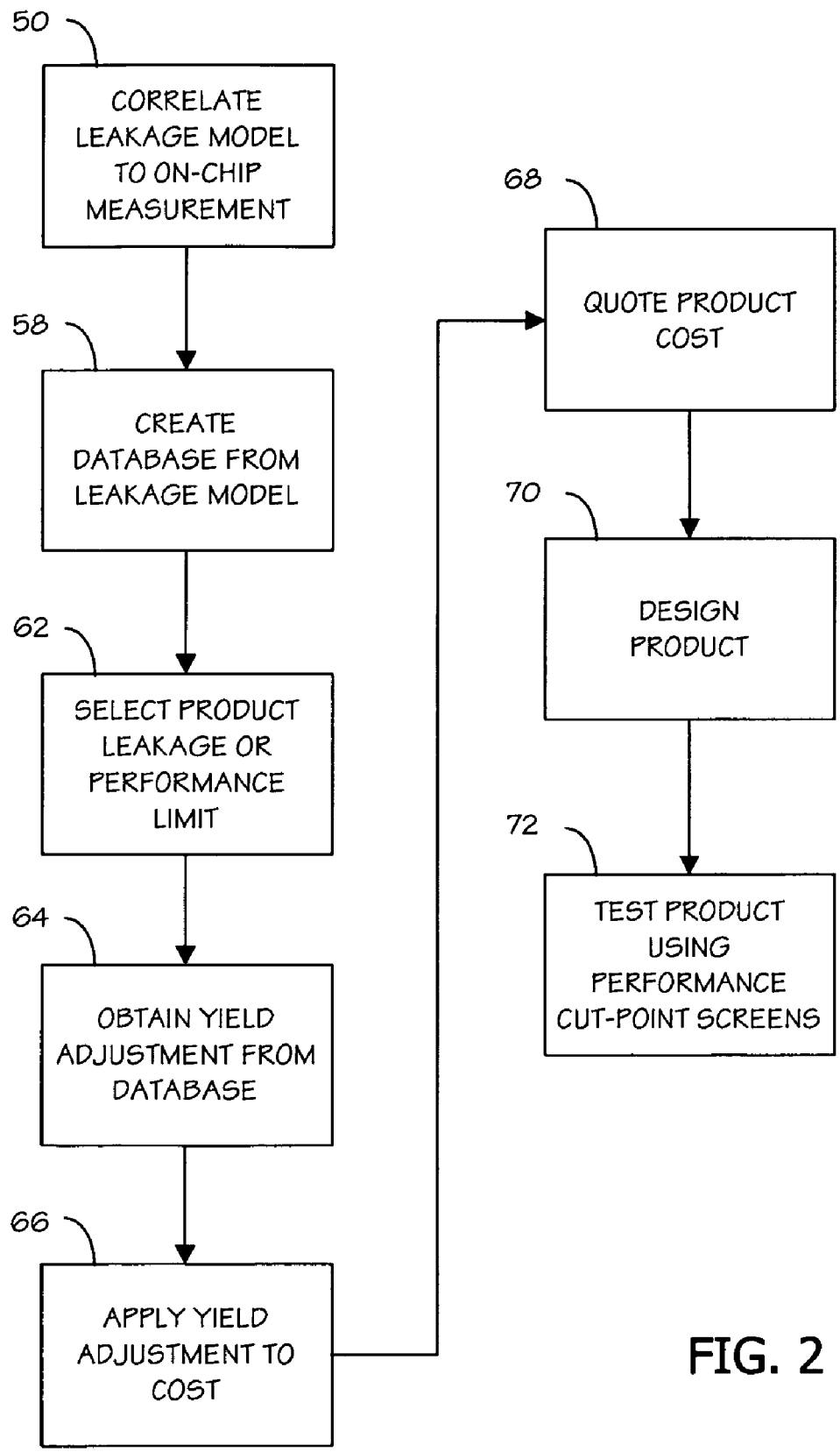
FIG. 2 is a flowchart showing a process capable of being executed by the computer of FIG. 1 to predict yield loss in a manner consistent with the invention.

In an exemplary embodiment of the method shown in the flowchart in FIG. 2, a leakage current model is developed and that model is then correlated to an on-chip measurement in block 50. In some embodiments, ring oscillator measurements or scan chain measurements may be used for performance correlations and IDDQ measurements may be used for leakage correlations. An exemplary correlation graph displaying delay as a function of leakage current for on-chip performance screen ring oscillator (PSRO) circuits is presented in FIG. 3. In this particular graph, the leakage model may be represented by line 52. On-chip measurement data points 54 are plotted on the graph to determine the correlation between the measurements and the leakage model. A statistical analysis of these points 54 may produce a correlation factor indicating how well the leakage model, or the performance model in other embodiments, models the data.

Figures 4, 5:
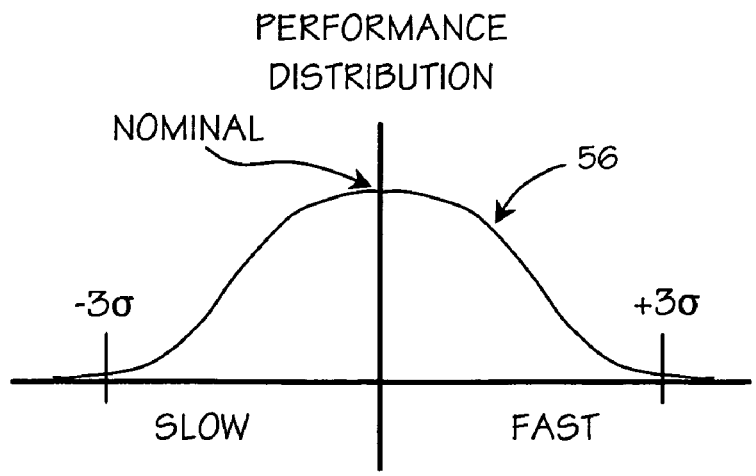
FIG. 4 is a statistical diagram of device performance.
FIG. 5 is a table stored in a database correlating statistical cut points to yield.

The statistical analysis of the data points 54 may also be used to produce a distribution 56, as displayed in FIG. 4, characterized by a mean or nominal chip speed and a standard deviation (i.e., sigma). For example, the distribution representing the leakage model may be a Gaussian or normal distribution, although the invention is not so limited. Using a six-sigma range around the nominal chip speed, for example, the statistical data would provide in excess of 99% yield, as is known from principles of statistical analysis. As the statistical range is changed around the nominal point, the correlated leakage or performance models may be used to estimate the parametric or circuit limited yield (CLY) and corresponding yield loss from the degrade in CLY for new products utilizing similar technologies. As appreciated by a person having ordinary skill in the art, CLY reflects the number of chips that meet performance specifications or, in other words, represents an expected product yield from the manufacturing.

Figure 3:
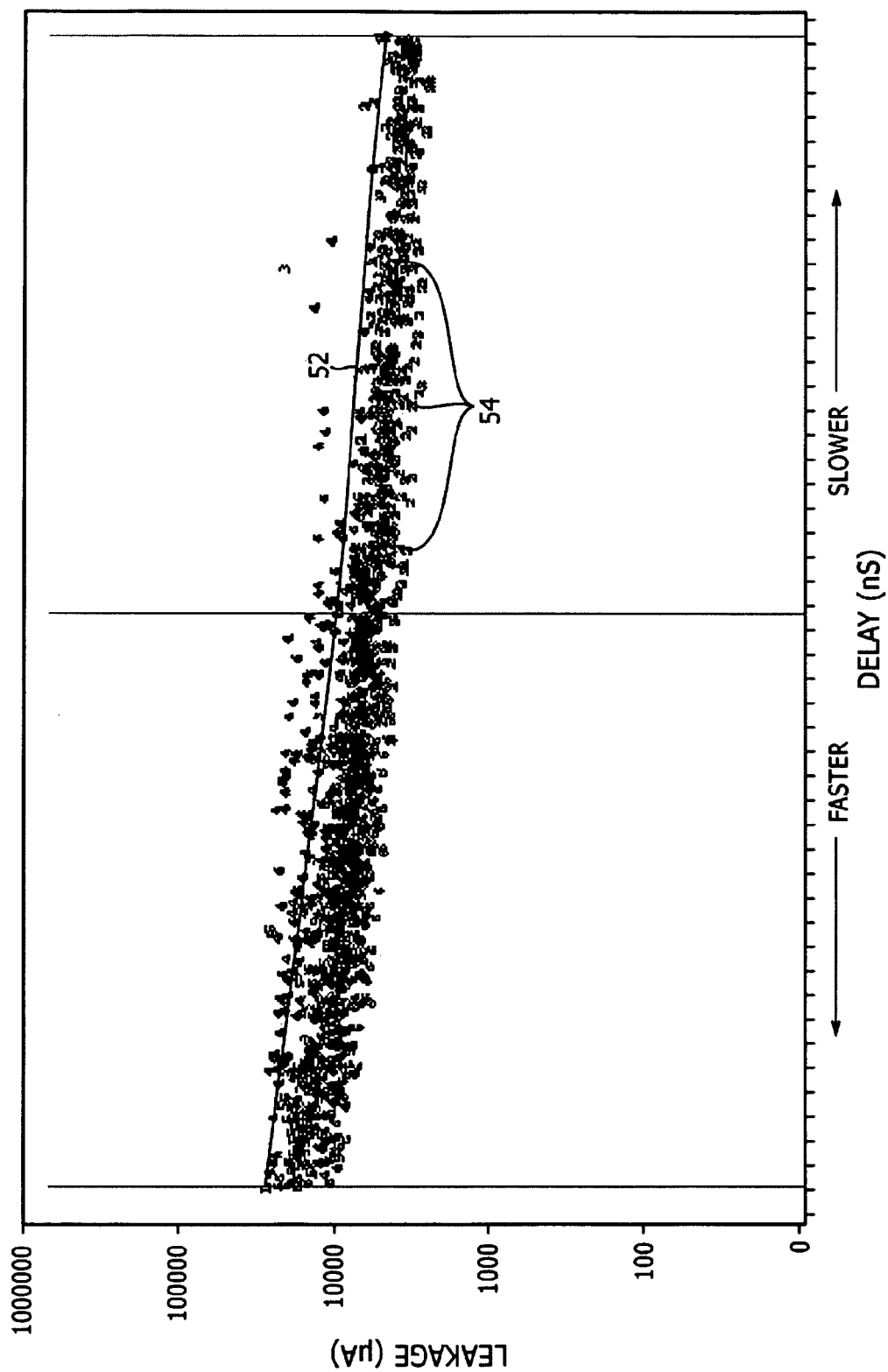
FIG. 3 is a graph showing the correlation of the leakage model to on-chip measurements as referenced in the flowchart in FIG. 2.

As seen in the leakage current graph in FIG. 3, leakage current increases as the delay decreases. Decreasing delays indicate increases in chip speeds. So, as the chips get faster, the leakage current rises which can cause more design hurdles or failures as discussed above. Likewise, leakage currents decrease as the chips get slower. However, the slowed performance of the chips is also not desirable.

Based on the model, the measured data and the statistical analysis performed above, a database may be created using the leakage model data in block 58 of the flowchart in FIG. 2. This analysis may use data obtained from test chip vehicles that contain representative circuits that will be used in products made in the silicon technology or representative products. The database may includes tables, such as the exemplary table 60 in FIG. 5, containing statistical cut-point ranges around, or on either side of, a nominal chip speed. For example, the statistical cut-point ranges may be the sigma cut-point ranges for on-chip performance screen ring oscillators. In some embodiments, the ranges for the statistical cut points may allocated be in half sigma increments, while increments of other sizes may be used in other embodiments. Based upon these statistical ranges of the statistical cut points, the circuit limited yield may be stored with the statistical ranges that then may be used later in providing quotes to customers.

During the product design phase, product leakage current levels and/or performance limits may be selected in block 62 based on design criteria. These limits may then be used to retrieve the CLY percentages from the databases in block 64, using a leakage estimation or performance estimation tool. The values of circuit limited yield may then be used to make adjustments to the cost for producing the product in block 66, incorporating the yield loss determined from the circuit limited yield. The cost to actually manufacture the die may be included in the database and referenced when factoring the CLY into the determination of an effective cost to quote to a customer. This effective cost may then be quoted to the customer in block 68.

In some embodiments, the process from blocks 62 through 68 may be an iterative process with a customer. For example, a customer may have design requirements that have a product sigma cut-point from 2.5 sigma fast to 2.5 sigma slow. After referencing the database and adjusting costs, a quote is provided to the customer based on the test screens. The quote reflects the product of the die cost and the CLY at the product sigma cut-point. If the quote is not acceptable to the customer, the customer may re-evaluate the design, for example, and may determine that a product sigma cut-point from 2.5 sigma fast to 3 sigma slow may be acceptable. A new quote may now be generated based on the new criteria. The quote reflects the product of the die cost and the CLY at the updated product sigma cut-point. The new quote is presented to the customer without the time delays required for contemporary approaches for generating quotes. This methodology allows for customer interaction and simple what-if analysis or sensitivity analysis that was impractical with contemporary practices.

Once the quote has been accepted by the customer, the product may be designed in block 70. In block 72, the product is tested using the performance cut-points as test screens for chip speed as a function of performance or leakage current as determined above. These values may then be again correlated to the leakage and/or performance models to ensure that the models are accurately predicting yields.

The disclosed embodiments can be applied to wafer test or, after packaging, to module test on any semiconductor integrated circuit product, including but not limited to application-specific integrated circuits, systems-on-a-chip integrated circuits, and programmable logic devices like field programmable gate arrays. Such integrated circuits can be used in end products destined by the customer for low-end applications like portable electronics and high-end applications like computers and automobiles or high end applications like mainframe computers and networking systems.

While all of the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the applicant's general inventive concept.

What is claimed is:

1. A method to predict yield loss associated with performance screens or leakage screens, the method comprising:
   correlating, by a computer, a leakage model to an on-chip measurement;
   determining, by a computer, current limited yields from the leakage model;
   forming a database relating performance sigma cut-points to the current limited yields; and
   quoting, by a computer, a product based on a current limited yield for one of the performance sigma cut-points taken from the database.

2. The method of claim 1 further comprising: designing the product or test chip vehicle; and testing the product or test chip vehicle using the performance sigma cut-points to screen the product.

3. The method of claim 1 wherein the on-chip measurement is an on-chip performance screen ring oscillator measurement.

4. The method of claim 1 wherein the on-chip measurement is a scan chain measurement.

5. The method of claim 1 wherein the on-chip measurement is an IDDQ measurement.

6. The method of claim 1 wherein the product is quoted to a customer at a cost, and quoting the product further comprises:
selecting a product leakage limit or a performance limit;
referencing the database to obtain the current limited yield corresponding to the product leakage limit or performance limit;
establishing a cost adjustment based upon the current limited yield;
modifying the cost by the adjustment to set an adjusted cost; and
quoting the adjusted cost to the customer.

7. The method of claim 6 wherein quoting the product comprises:
estimating leakage data or performance data;
identifying a specific performance sigma cut-point from the performance sigma cut-points in the database that corresponds to the estimated leakage data or the estimated performance data; and
obtaining the current limited yield that corresponds to the specific performance sigma cut-point.

8. The method of claim 1 wherein designing the product comprises:
verifying that a design matches a product quote;
in response to a difference between the design and the product quote, requoting the product; and
building a test file of performance sort criteria for use in product testing.

9. An apparatus comprising:
a processor; and
program code configured to be executed by the processor for predicting yield loss associated with performance and leakage screens, the program code configured to correlate a leakage model to an on-chip measurement, determine current limited yields from the leakage model, form a database relating performance sigma cut-points to the current limited yields, and quote a product based on a current limited yield for one of the performance sigma cut-points taken from the database.

10. The apparatus of claim 9 wherein the program code is further configured to design the product, and test the product using the performance cut-points to screen the product.

11. The apparatus of claim 9 wherein the on-chip measurement is selected from a group consisting of a ring oscillator measurement, a scan chain measurement, and an IDDQ measurement.

12. The apparatus of claim 9 wherein the program code is further configured to quote the product by:
selecting a product leakage limit or a performance limit;
referencing the database to obtain the current limited yield corresponding to the product leakage limit or performance limit;
establishing a cost adjustment based upon the current limited yield;
modifying the cost by the adjustment to set an adjusted cost; and
quoting the adjusted cost to the customer.

13. The apparatus of claim 12 wherein the program code is further configured to quote the product by:
estimating leakage data or performance data;
identifying a specific performance sigma cut-point from the performance sigma cut-points in the database that corresponds to the estimated leakage data or the estimated performance data; and
obtaining the current limited yield that corresponds to the specific performance sigma cut-point.

14. The apparatus of claim 9 wherein the program code is further configured to design the product by:
verifying that a design matches a product quote;
in response to a difference between the design and the product quote, requoting the product; and
building a test file of performance sort criteria for use in product testing.

15. A program product comprising a computer readable storage medium having computer readable program code stored thereon and the computer readable program code configured to control a computer to perform the method comprising:
predicting yield loss associated with performance and leakage screens;
correlating a leakage model to an on-chip measurement;
determining current limited yields from the leakage model
forming a database relating performance sigma cut-points to the current limited yields; and
quoting a product based on a current limited yield for one of the performance sigma cut-points taken from the database.

16. The program product of claim 15 wherein the program code is further configured to design the product, and test the product using the performance cut-points to screen the product.

17. The program product of claim 15 wherein the on-chip measurement is selected from a group consisting of a ring oscillator measurement, a scan chain measurement, and an IDDQ measurement.

18. The program product of claim 9 wherein the program code is further configured to quote the product by:
selecting a product leakage limit or a performance limit;
referencing the database to obtain the current limited yield corresponding to the product leakage limit or performance limit;
establishing a cost adjustment based upon the current limited yield;
modifying the cost by the adjustment to set an adjusted cost; and
quoting the adjusted cost to the customer.

19. The program product of claim 18 wherein the program code is further configured to quote the product by:
estimating leakage data or performance data;
identifying a specific performance sigma cut-point from the performance sigma cut-points in the database that corresponds to the estimated leakage data or the estimated performance data; and
obtaining the current limited yield that corresponds to the specific performance sigma cut-point.

20. The program product of claim 15 wherein the program code is further configured to design the product by:
verifying that a design matches a product quote;
in response to a difference between the design and the product quote, requoting the product; and
building a test file of performance sort criteria for use in product testing.

* * * * *